United States Patent [19]
Lee et al.

[11] Patent Number: 5,531,859
[45] Date of Patent: Jul. 2, 1996

[54] ELECTRONIC COMPONENT FEEDER

[75] Inventors: Jung D. Lee; Yong G. Lee, both of Seoul, Rep. of Korea

[73] Assignee: Daewoo Heavy Industries Ltd., Incheon, Rep. of Korea

[21] Appl. No.: 355,776

[22] Filed: Dec. 14, 1994

[30] Foreign Application Priority Data

Dec. 29, 1993 [KR] Rep. of Korea .................. 93-30448

[51] Int. Cl.⁶ ........................................ B65H 5/28
[52] U.S. Cl. .................. 156/584; 156/344; 221/25; 221/72; 221/87; 226/8; 226/139; 414/411
[58] Field of Search .................... 156/344, 584; 221/25, 72, 73, 87; 414/411; 226/8, 139

[56] References Cited

U.S. PATENT DOCUMENTS

| | | |
|---|---|---|
| 4,438,559 | 3/1984 | Asai et al. |
| 4,887,778 | 12/1989 | Soth et al. .................. 226/139 X |
| 4,943,342 | 7/1990 | Golemon .................. 156/584 |
| 5,342,474 | 8/1994 | Mohara et al. .................. 156/584 |
| 5,419,802 | 5/1995 | Nakatsuka et al. .................. 156/584 |

FOREIGN PATENT DOCUMENTS 63-178593  7/1988  Japan.

*Primary Examiner*—Mark A. Osele
*Attorney, Agent, or Firm*—Lowe, Price, LeBlanc & Becker

[57] ABSTRACT

An electronic component feeder is provided for transferring a succession of electronic components borne by a carrier tape toward a pickup position one by one, the carrier tape having a backing strip and a protective cover strip adhesively secured to the backing strip to hold the electronic components in position. The feeder comprises a tape reel about which the carrier tape is wound; a transfer mechanism intermittently operable for advancing the carrier tape toward the pickup position each time at a predetermined pitch; a takeup mechanism operable in synchronism with the transfer mechanism for winding up the protective cover strip peeled from the carrier tape; a shuttle rod for operatively coupling the transfer mechanism and the takeup mechanism to enable them to move in concert, the shuttle rod having a plurality of locator holes each for along of the shuttle rod; an actuator for reciprocating the shuttle rod to cause a synchronized movement of the transfer mechanism and the takeup mechanism, the actuator including a cylinder and a piston rod extendibly fitted into the cylinder; an interconnector block fixedly attached to the piston rod at a first end and slidably engaged with the shuttle rod at a second end; and a locator pin carried by the interconnector block for selective engagement with one of the locator holes of the shuttle rod.

10 Claims, 4 Drawing Sheets

ELECTRONIC COMPONENT FEEDER

FIELD OF THE INVENTION

The present invention is generally directed to an electronic component feeder, and more specifically to an automatic electronic component feeder adapted to transfer a succession of electronic components or parts uniformly distributed on a carrier tape one by one toward a pickup head of an electronic component mounter in an intermittent fashion.

DESCRIPTION OF THE PRIOR ART

Automation of the electronic component mounting process requires that identically shaped parts, e.g., semiconductor chips, or other electronic components, should be borne on a carrier tape and then transferred to a pickup head of an electronic component mounter by way of periodically advancing the carrier tape.

The pickup head is able to grip the individual electronic component at a pickup position to bring it into a given mounting position on a printed circuit board. Conventionally, use has been made of a carrier tape that consists of a backing strip having recesses for reception of the electronic components therein and a protective cover strip adhesively bonded to the backing strip to hold the electronic components in place within the recesses. Along the opposite lateral edges of the backing strip, a multiplicity of feed holes are provided at a predetermined pitch so as to mesh a sprocket wheel of a transfer mechanism. As a rule, the feed holes need to be formed along only one lateral edge of the backing strip in case of a carrier tape of narrow width, e.g., 12 mm or 24 mm wide carrier tape. With respect to a carrier tape of 32 mm or more in width, it would be desirable to form the feed holes along both of the lateral edges of the backing strip.

A variety of electronic component feeders have been extensively employed to feed the electronic component held on the carrier tape to the pickup head of the electronic component mounter. Typically, the conventional electronic component feeders include, inter alia, a supply reel around which is wound a carrier tape consisting of a backing strip and a protective cover strip, a transfer mechanism intermittently operable for unwinding the carrier tape from the supply reel to feed it toward a pickup head, a guide mechanism for guiding the carrier tape along a passageway defined between the supply reel and the pickup head, a takeup mechanism intermittently operable in synchronism with the transfer mechanism for winding up the protective cover strip peeled from the carrier tape and an actuator mechanism for causing the transfer mechanism and the takeup mechanism to simultaneously operate each time when the pickup head performs up/down movement to grip the electronic component brought into the pickup position.

As a specific prior art example, U.S. Pat. No. 4,438,559 issued to Asai et al. on Mar. 27, 1984 discloses an electronic component mounting apparatus capable of automatically mounting onto a printed circuit board a succession of electronic components which are sequentially fed with a carrier tape. The electronic component mounting apparatus includes a tape feeder and a cutting blade for severing the carrier tape into a plurality of segments each carrying an electronic component thereon. In addition, the tape feeder is provided with a cam-actuated sprocket wheel for advancing the carrier tape unwound from a supply reel, a tape retainer for allowing the carrier tape to move along a given travel path and a takeup reel for winding up a cover strip peeled from the carrier tape.

Japanese Patent Pre-examination Publication No. 63-178593 laid open to a public inspection on Jul. 22, 1988 teaches an electronic component feeder of the class comprising a swingable lever operatively coupled to a drive source for pivotal movement in an intermittent manner, a ratchet mechanism connected to the swingable lever to cause a carrier tape move forward, an operating lever driven by the swingable lever and a push pin affixed to the free end of the operating lever for pressing the underside of the carrier tape to push up electronic components out of the recesses of the carrier tape one by one. Provision of the push pin plays a significant role in prohibiting any pickup error which would otherwise occur.

SUMMARY OF THE INVENTION

An object of the invention is to provide an electronic component feeder which has an enhanced performance and an improved adaptability to different kinds of electronic component mounters over the prior art feeders.

Another object of the invention is to provide an electronic component feeder which has the ability to adjust the transfer pitch of a carrier tape in exact correspondence to the spacing of electronic components uniformly disposed on the carrier tape.

A further object of the invention is to provide an electronic component feeder which makes it possible to feed a carrier tape of relatively great width in a dependable manner without causing any undesirable distortion to the carrier tape.

With these objects in view, the invention provides an electronic component feeder for transferring a succession of electronic components uniformly disposed on a carrier tape one by one toward a pickup position, the carrier tape having a backing strip and a protective cover strip peelably secured on the backing strip to hold the electronic components in place. The feeder comprises a tape reel around which the carrier tape is wound, a transfer mechanism intermittently operable for advancing the carrier tape toward the pickup position each time at a predetermined pitch, a takeup mechanism operable in synchronism with the transfer mechanism for winding up the protective cover strip peeled from the carrier tape, a shuttle rod for operatively coupling the transfer mechanism and the takeup mechanism to enable them to move in concert, the shuttle rod having a plurality of locator holes each formed along a length of the shuttle rod, an actuator for reciprocating the shuttle rod to cause a synchronized movement of the transfer mechanism and the takeup mechanism, the actuator provided with a cylinder and a piston rod extendible from the cylinder, an interconnector block fixedly attached to the piston rod at a first end and slidably engaged with the shuttle rod at a second end and a locator pin carried by the interconnector block for selective engagement with one of the locator holes of the shuttle rod.

BRIEF DESCRIPTION OF THE DRAWINGS

Other objects, features and advantages of the invention will become apparent from a review of the following detailed description of the preferred embodiment taken in conjunction with the accompanying drawings in which.

DETAILED DESCRIPTION OF THE PREFERRED EMBODIMENT

Figure 1:
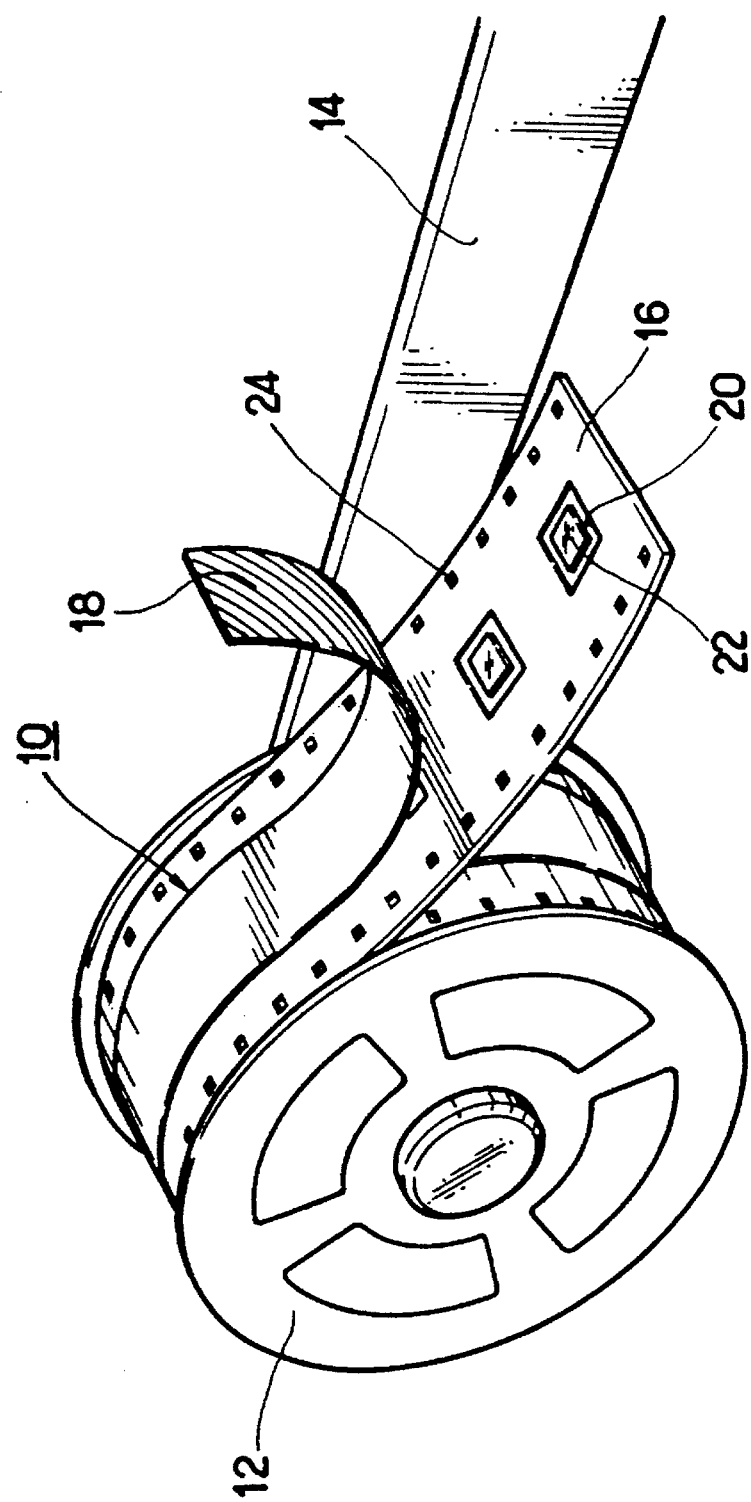
FIG. 1 is a perspective view of the typical tape reel rotatably supported on a reel frame, illustrating a number of electronic components uniformly disposed along the length of a carrier tape.

Referring now to FIG. 1, there is shown by way of example a tape reel 12 rotatably supported by a reel frame 14. The tape reel 12 is wound with a carrier tape 10 which is to be transferred to a pickup position by means of the inventive electronic component feeder. The tape reel 12 is adapted to be manually replaced by a new one each time the carrier tape is exhausted in its entirety. As shown, the carrier tape 10 consists of a backing strip 16 of relatively large thickness and a protective cover strip 18 adhesively bonded to an upper surface of the backing strip 16 in a peelable condition.

It can be appreciated that the backing strip 16 has a succession of generally rectangular recesses 20 each receiving an electronic component 22, e.g., semiconductor chip, of similar or identical configuration. Provided along the opposite lateral edges of the backing strip 16 are first and second rows of feed holes 24 which would come into engagement with sprocket wheels of a transfer mechanism set forth below. Inasmuch as the carrier tape 10 in the illustrated example has a significantly large, e.g., more than 32 mm of width, it is desirable or even necessary to provide the feed holes 24 along the both edges of the backing strip, thus assuring stable transportation of the carrier tape 10. For a carrier tape of smaller width than the illustrated example, it would suffice to form the feed holes along a single edge of the backing strip 16.

Figure 2:
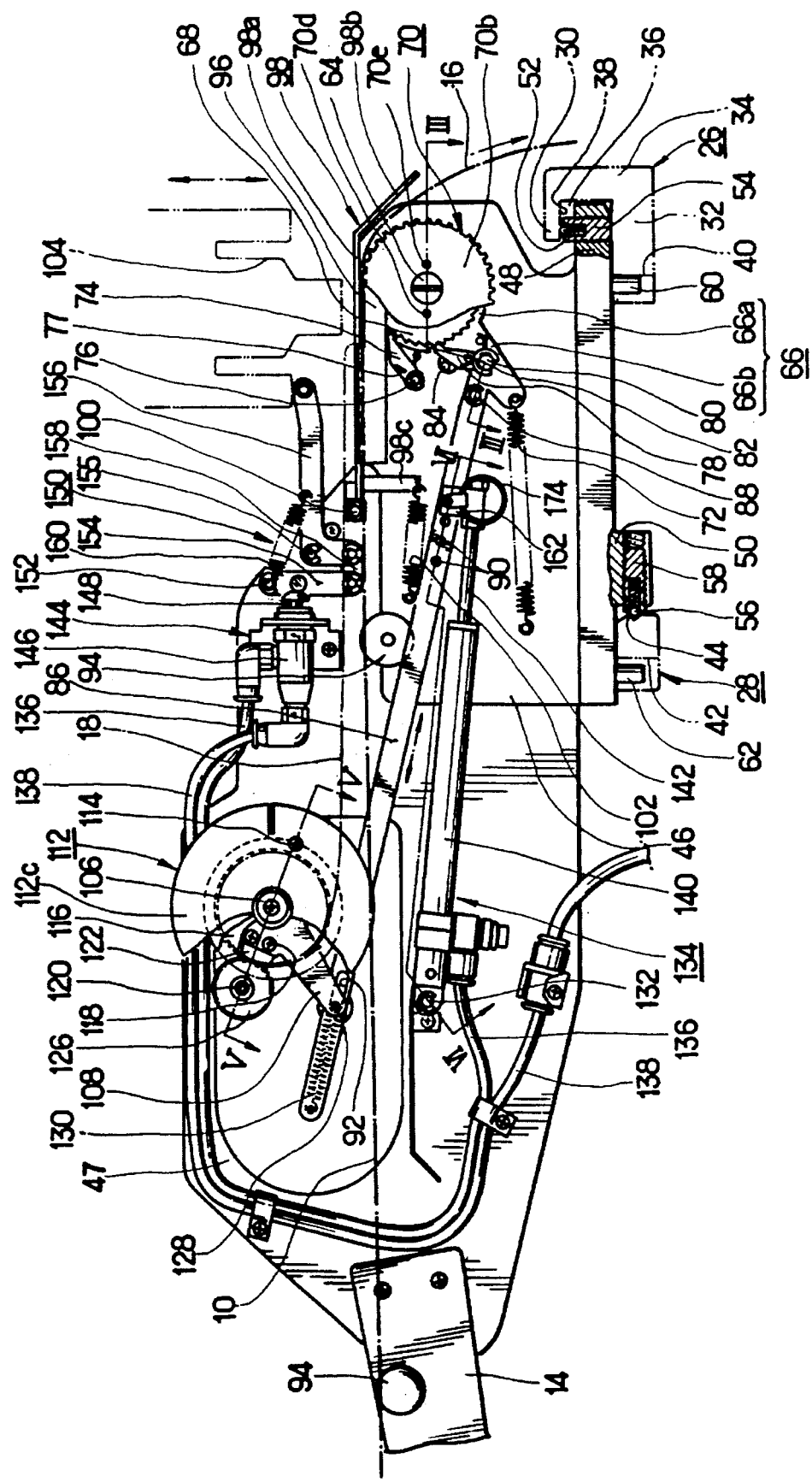
FIG. 2 is a side elevational view showing the electronic component feeder made in accordance with the instant invention, with portions thereof removed for the sake of simplicity.

FIG. 2 shows an exemplary preferred embodiment of the instant electronic component feeder that lends itself to an intermittent transfer of the carrier tape 10 toward the pickup position. The electronic component feeder may be removably mounted on first and second jigs 26, 28 that constitute an electronic component mounter (not shown). As depicted in phantom lines, the first jig 26 is provided with an upper extension 30, a lower extension 32 substantially parallel to the upper extension 30 and a vertical extension 34 interconnecting the upper and lower extensions 30, 32 together, each of the extensions 30, 32, 34 cooperating one another to define a channel 36 therebetween. The upper extension 30 has a horizontal bearing surface 38, with the lower extension 32 having a vertical stop surface 40 at its rear edge. On the other hand, the second jig 28 is spaced apart a given distance from the first jig 26 and is disposed at the same elevation as the lower extension 32 of the first jig 26. The second jig 28 has a vertical stop surface 42 at its rear edge and a notch 44 formed at the opposite side of the vertical bearing surface.

As best shown in FIG. 2, the electronic component feeder comprises a frame 46 that can be detachably mounted on the first and second jigs 26, 28. The frame 46 is provided with a front finger 48 extending forward from the frontal edge of the frame 46 and an intermediate leg 50 extending downward from the underside of the frame 46. The front finger 48 is adapted to carry a first plunger 54 having a spring-biased ball 52, whereas the intermediate leg 50 is provided with a second plunger 58 having a spring-biased ball 56. Additionally, a first stopper pin 60 extends downward from the proximal end of the front finger 48, with a second stopper pin 62 extending downward from the underside of the frame 46 in a spaced relationship with respect to the intermediate leg 50. Fixedly attached to the rear side of the frame 46 is a rear plate 47 that serves to support various parts of the electronic component feeder.

To mount the electronic component feeder of the above construction on an electronic component mounter, it is required to first bring the frame 46 into a rough alignment with the first and second jigs 26, 28 so that the front finger 48 may lie in front of the channel 36 of the first jig 26, with the underside of the frame 46 somewhat spaced apart from the top surface of the second jig 28. Under this state, pushing the frame 46 forward, i.e., in the righthand direction of FIG. 2 would result in the front finger 48 sliding into the channel 36 of the first jig 26, thus making the spring-biased ball 52 of the first plunger 54 bear against the horizontal bearing surface 38. Concurrently with this behavior, the first and second stopper pins 60, 62 would get closer to or come into abutment with the vertical stop surfaces 40, 42 of the first and second jigs 26, 28, respectively. Making the frame 46 swing counterclockwise about the front finger 48 will then cause the spring-biased ball 56 of tile second plunger 58 to be urged into the notch 44. By virtue of the foregoing manipulation, all the process of mounting the electronic component feeder comes to an end. Demounting the electronic component feeder may be rendered effective in the reverse order of the mounting process stated above.

Figure 3:
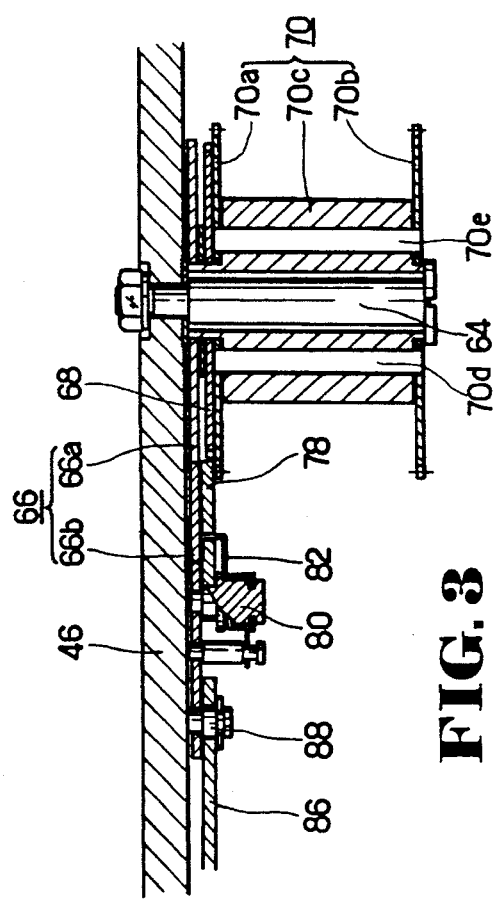
FIG. 3 is an enlarged, sectional view taken along line III—III of FIG. 2, showing the transfer mechanism employed in the electronic component feeder.

FIG. 3 is a sectional view taken along line III—III of FIG. 2, showing a transfer mechanism that serves to intermittently advance the carrier tape each time at a predetermined pitch to thereby supply electronic components to the pickup position one after another. The transfer mechanism includes a main shaft 64 which is detachably secured to the frame 46 by means of, e.g., a bolt/nut fastener. Rotatably fitted on the main shaft 64 are a rotary plate 66, a ratchet wheel 68 and a sprocket assembly 70. As best shown in FIG. 2, the rotary plate 66 is provided with a disk portion 66a and a lever portion 66b extending radially outwardly from the disk portion 66a. The lever portion 66b is connected at its free end to the frame by a tension spring 72 to make the rotary plate urged clockwise. The ratchet wheel 68 is designed to rotate with the sprocket assembly 70 in unison and has a multiplicity of teeth formed along its full perimeter. The sprocket assembly 70 includes a pair of spaced apart sprocket wheels 70a, 70b and a hub 70c connecting the sprocket wheels 70a, 70b together. Each of the sprocket wheels 70a, 70b has a plurality of circumferentially distributed spikes whose pitch is substantially the same as the spacing of the feed holes 24 of the carrier tape 10. In addition to the above, the sprocket assembly 70 is formed with a pair of parallel alignment holes 70d, 70e that serve mainly to prohibit misalignment between the spikes of one sprocket wheel 70a and the spikes of the other sprocket wheel 70b.

As best illustrated in FIG. 2, in the vicinity of the ratchet wheel 68, a detent pawl 74 is swingably mounted on the frame 46 as by a pivot axis 76. The detent pawl 74 is normally biased against the ratchet wheel 68 by virtue of a torsion spring 77, thus permitting clockwise rotation of the ratchet wheel 68 but inhibiting any counterclockwise movement of the latter. At the lever portion 66b of the rotary plate 66, a feed pawl 78 is rotatably secured by a pivot axis 80 and urged against the ratchet wheel 68 by a torsion spring 82. The feed pawl 78 should float over the teeth of the ratchet wheel 68 as the rotary plate 66 rotates counterclockwise about the main shaft 64. When the rotary plate 66 gets back to its initial position by the restoring force of the tension spring 72, the feed pawl 78 should come into engagement with the teeth of the ratchet wheel 68 to cause clockwise rotation of the sprocket assembly 70. An eccentric cam shaft 84 assists in adjusting the initial rest position of the rotary plate 66.

It should be appreciated that a shuttle rod 86 of thin cross-sectional configuration is connected to the lever portion 66b of the rotary plate 66 by means of a pivot pin 88 and will be subjected to reciprocating movement as by a pneumatic actuator explained below. The shuttle rod 86 has an array of, e.g., four, substantially equally disposed locator holes 90 which are formed adjacent to the first end of the shuttle rod 86 and a slot 92 which extends longitudinally at a position adjacent to the second end of the shuttle rod 86. The pitch adjustment role that can be played by the locator holes 90 and other pertinent parts will be set out later in detail. Although the shuttle rod 86 is shown in the drawings to have four locator holes, the exact number of such locator holes has no significant meaning in practising the invention and therefore may be lesser or greater.

Figure 4:
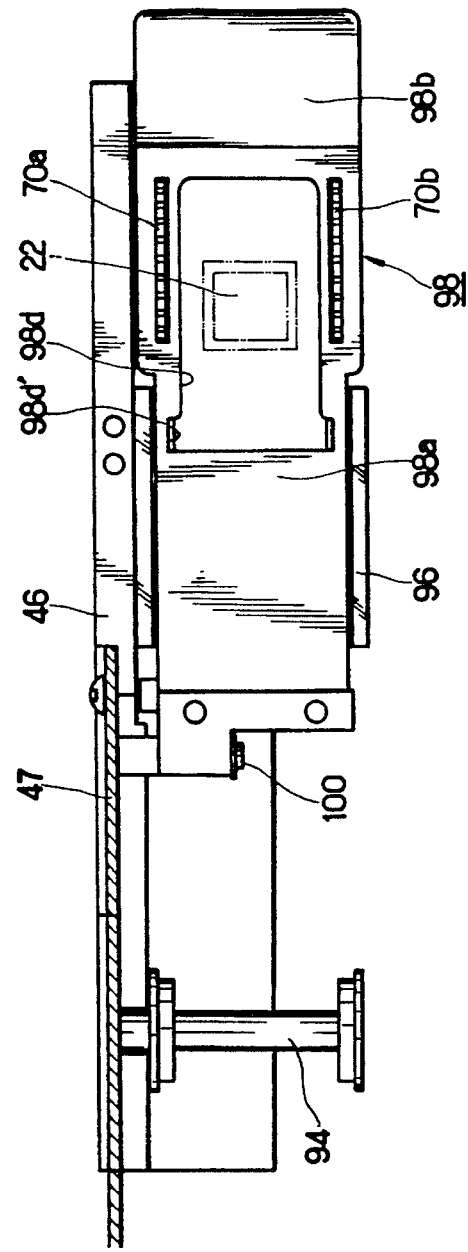
FIG. 4 is a top view illustrating the environmental structure of the electronic component pickup position on an enlarged scale.

Referring collectively to FIGS. 2 and 4, it can be seen that a guide mechanism is mounted on the rear plate 47 to assure stable transfer of the carrier tape 10 along a given travel path. In the illustrated embodiment, the guide mechanism includes a guide pin 94 located upstream of the travel path, a guide block 96 rigidly affixed at the electronic component pickup position in a spaced relationship with the guide pin 94 and a tape retainer 98 placed over the guide block 96 with an appropriate gap for keeping the carrier tape 10 in close engagement with the sprocket wheels 70a, 70b during its transportation.

The tape retainer 98, pivotably attached to the rear plate 47 by a pivot pin 100, includes a horizontally extending flat portion 98a lying above the guide block 96 in a substantially parallel relationship thereto, a sloping portion 98b extending forwardly downwardly from the frontal end of the flat portion 98a and a vertical projection 98c suspended from the rear end of the flat portion 98a. As can be clearly seen in FIG. 2, the vertical projection 98c is associated at its free end with the frame 26 by a tension spring 102, ensuring that the tape retainer 98 be normally biased in the clockwise direction. Referring back to FIG. 4, the flat portion 98a of the tape retainer 98 is shown to have a rectangular opening 98d through which the electronic component 22 may be exposed to a pickup head 104 (see FIG. 2). The opening 98d is provided with an enlargement (98d') at its rear end, viz., at the left side end in the drawings to allow the protective cover strip 18 peeled from the carrier tape 10 to path therethrough and turn backwardly toward the below mentioned takeup mechanism. The electronic component 22 exposed through the rectangular opening 98d would be gripped by the pickup head 104 and then transported to a predetermined mounting position on a printed circuit board (not shown).

Figure 5:
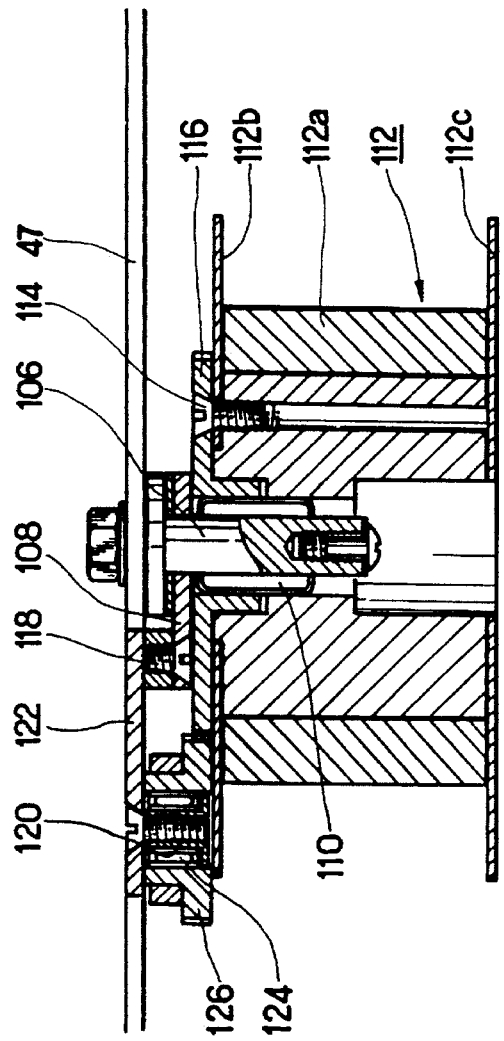
FIG. 5 is an enlarged, sectional view taken along line V—V of FIG. 2, showing the takeup mechanism for winding up a protective cover strip peeled from the carrier tape.

A takeup mechanism shown in FIG. 5 is employed in winding up the protective cover strip 18 peeled from the carrier tape 10. The takeup mechanism comprises a reel shaft 106 bolted to the rear plate 47, a reel drive lever 108 rotatably fitted on the reel shaft 106, a takeup reel assembly 112 unidirectionally rotatably mounted on the reel shaft 106 through a first oneway clutch bearing 110, a sun gear 116 fixedly secured to the takeup reel assembly 112 by a screw 114 for unitary rotation therewith, a support lever 122 secured at one end to the reel drive lever 108 by a screw 118 and carrying a pin-like shaft 120 at the other end, the pin-like shaft 120 extending in parallel with the reel shaft 106, and a planetary gear 126 unilaterally rotatably mounted on the pin-like shaft 120 through a second oneway clutch bearing 124 in a meshing relationship with the sun gear 116. In the embodiment depicted in FIG. 5, the first oneway clutch bearing 110 is adapted to prohibit any counterclockwise rotation of the takeup reel assembly 112 and the sun gear 116 about the reel shaft 106, the second oneway clutch bearing 124 serving to prevent any clockwise rotation of the planetary gear 126 about the pin-like shaft 120. The takeup reel assembly 112 is provided with a hub 112a around which the protective cover strip 18 may be wound and a pair of spaced apart, coextensive flanges 112b, 112c, each of which is secured to the opposite ends of the hub 112a. At its free end, the reel drive lever 108 has a pin 128 which may be slidably fitted into the slot 92 of the shuttle rod 86 and resiliently pulled toward the free end of the shuttle rod 86 by a tension spring 130, as clearly illustrated in FIG. 2. As will be described below in detail, the takeup reel assembly 12 would be subjected to an intermittent clockwise rotation in synchronism with the rotational movement of the sprocket assembly 70, so as to wind up the protective cover strip 18 which is peeled from the carrier tape 10.

Figure 6:
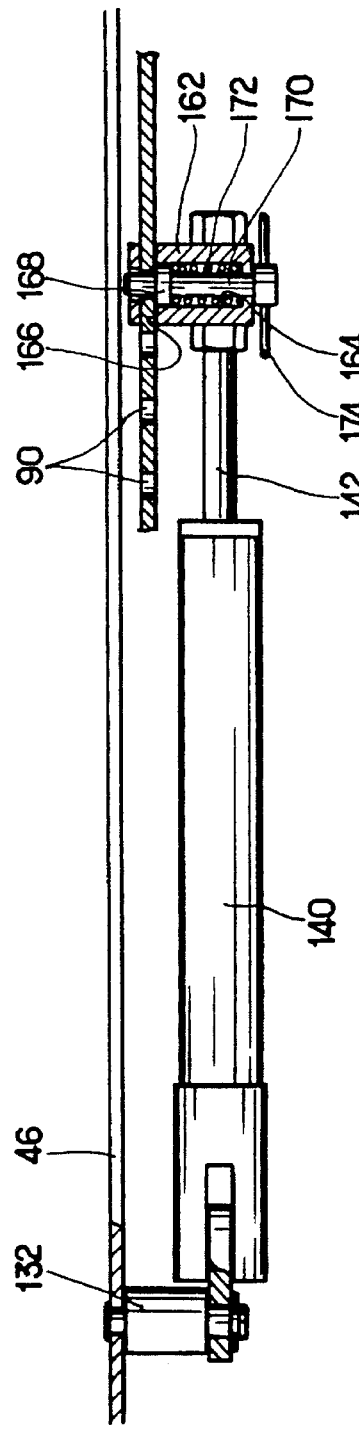
FIG. 6 is an enlarged, sectional view taken along line VI—VI of FIG. 2, depicting the pneumatic actuator and the pitch adjustment mechanism.

A pneumatic drive mechanism exemplified in FIGS. 2 and 6 may be used in reciprocating the shuttle rod 86 to rotatably drive the sprocket assembly 70 and the takeup reel assembly 112. The pneumatic drive mechanism includes, among other things, a pneumatic actuator 134 which is pivotably attached to the rear plate 47 by virtue of a pivot pin 132. The pneumatic actuator 134 is composed of a cylinder 140 communicating with a pneumatic pressure source (not shown) via first and second air lines 136, 138 and a piston rod 142 extendibly fitted into the cylinder 140. The piston rod 142 may be detachably interconnected at its free end to file shuttle rod 86 by means of a pitch adjustment mechanism set forth below. Positioned between the first and second air lines 136, 138 is a mechanical valve 144 for selectively cutting off and permitting flow of the pressurized air. The mechanical valve 144 includes a valve body 146 and a valve stem 148 air-tightly fitted into the valve body 146. The valve stem 148 is normally extended outwardly by a compression spring (not shown) to cut off air flow through the mechanical valve 144. The pressurized air can flow from the second air line 138 to the first air line 136 only if the valve stem 148 is pushed inwardly against the compression spring. Operation of the mechanical valve 144 is governed by a link device 150 which has a first lever 154 pivotably attached to the rear plate 47 by a pivot pin 152, a second lever 156 similarly mounted on the rear plate 47 by a pivot pin 155 and a third lever 158 hingedly linking the first and second levers 154, 156 together, the second lever 156 normally pulled in the counterclockwise direction by a tension spring 160. Pressing down the free end of the second lever 156 by a descending movement of the pickup head 104 will cause the second lever 156 to rotate clockwise about the pivot pin 155 against the resistant force of the tension spring 160, which in turn leads to a unitary clockwise rotation of the first lever 154 about the pivot pin 152, thus resulting in retraction of the valve stem 148 to allow fluid communication between the first and second air lines 136, 138.

FIG. 6 shows a pitch adjustment mechanism carried by the piston rod 142 of the pneumatic actuator 140 to enable the transfer pitch of the carrier tape 10 to be changed in a convenient manner. The pitch adjustment mechanism is provided with an interconnector block 162 bolted to the free end of the piston rod 142, the interconnector block 162 having a central bore 164 and a transverse groove 166 formed across the central bore 164. A locator pin 170 with an annular stop ridge 168 at its middle portion is fitted through the central bore 164. Slidably combined into the transverse groove 166 is those portion of the shuttle rod 86 at which the locator holes 90 are distributed. A compression spring 172 is retained within the central bore 164 in order to bias the front end of the locator pin 170 into engagement with one of the locator holes 90. The locator pin 170 has at its rear end a ring-shaped handle 174 that may be used for manual backward pulling of the locator pin 170 out of the locator hole 90. Under the state that the locator pin 170 is pulled backward, retraction of the piston rod 142 would cause the interconnector block 162 to move leftward in FIG. 6, thereby bringing the locator pin 170 into alignment with another locator hole. At this moment, if the ring-shaped handle 174 is released, the locator pin 170 will enter into the newly aligned locator hole by the action of the compression spring 172. In this way, it becomes possible to change the stroke of the shuttle rod 86, i.e., the transfer pitch of the carrier tape 10 in accordance with the operator's desire. Under the condition shown in FIG. 6, the carrier tape 10 will be intermittently transferred at the smallest pitch for the reason that the locator pin 170 remains fitted with the leftmost locator hole.

In the following, description will be focused on the operation of the electronic component feeder with reference mainly to FIG. 2.

Prior to commencing automatic feeding of the electronic components toward their pickup position, the tape reel 12 is first mounted on the reel frame 14 in a freely rotatable manner. With the tape retainer 98 rotated counterclockwise into an open position, the carrier tape 10 is forcedly pulled away from the tape reel 12 until the leading edge thereof reaches the electronic component pickup position. Subsequent step is to peel off the protective cover strip 18 from the carrier tape 10. The cover strip 18 so peeled is forwarded to the takeup reel assembly 112 through the opening 98d of the tape retainer 98 (see FIG. 4), with the support strip 16 meshed with the spikes of the first and second sprocket wheels 70a, 70b at the feed holes 24 thereof. The tape retainer 98 is then rotated clockwise into a closed position and the cover strip 18 is anchored to the takeup reel assembly 112. By way of slightly rotating the takeup reel assembly 112 clockwise to give a tension to the cover strip 18, all the manual setout operation comes to an end.

At the beginning of automatic tape feeding process, the pickup head 104 of the electronic component mounter is caused to descend toward the carrier tape 10, during which operation the free end of the second lever 156 would be pressed downward. As a result, the second lever 156 will rotate clockwise about the pivot pin 155 against the resistant force of the tension spring 160, thus causing a similar clockwise movement of the first lever 154. In response, the valve stem 148 of the mechanical valve 144 is retracted to allow fluid communication between the first and second air lines 136, 138, with the result that the pneumatic actuator 134 is fed with the pressurized air from the pneumatic pressure source. Accordingly, the piston rod 142 is extended to displace the shuttle rod 86 forwardly, i.e., in the rightward direction in FIG. 2, in response to which the rotary plate 66 is caused to rotate counterclockwise against the tension spring 72. During the course of counterclockwise rotation of the rotary plate 66, the feed pawl 78 would float over the teeth of the ratchet wheel 68 but the detent pawl 74 would come into meshing engagement with the teeth of the ratchet wheel 68 to thereby prevent any reverse or counterclockwise rotation of the ratchet wheel 68 and hence the sprocket assembly 70. Concurrently with the forward movement of the shuttle rod 86, the reel drive lever 108 will experience counterclockwise angular movement, in which time the planetary gear 126 would revolve around the sun gear 116 in the counterclockwise direction. At this moment, the sun gear 116 and the takeup reel assembly 112, should remain immovable by virtue of the first oneway clutch bearing 110 as schematically shown in FIG. 5.

To the contrary, as the pickup head 104 ascends along with the electronic component gripped thereby, the second lever 156 is gradually released from depression so as to turn counterclockwise by the restoring force of the tension spring 160. This will cause the first lever 154 to swing counterclockwise, assuring that the valve stem 148 come back to its initial position. The result is that the fluid communication between the first and second air lines 136, 138 should be cut off, with no compressed air fed into the cylinder 140 of the pneumatic actuator 134. The rotary plate 56 is then pulled into the initial position by means of the tension spring 72 so that the shuttle rod 86 can move backward, i.e., in the leftward direction in FIG. 2, to have the piston rod 142 retracted. As the rotary plate 66 continues to undergo clockwise rotation, the feed pawl 74 will come into engagement with the teeth of the ratchet wheel 68 to rotate therewith in the clockwise direction, at the moment of which the detent pawl 74 is made to run over the teeth of the ratchet wheel 68. As a consequence, the sprocket assembly 70 physically combined with the ratchet wheel 68 will experience clockwise rotation within a limited angular extent to advance the carrier tape 10 by a predetermined pitch. This brings a new electronic component into the pickup position for the next pickup operation.

The clockwise rotation of the rotary plate 66 is transmitted to the reel drive lever 108 of the takeup mechanism through the shuttle rod 68 to have the lever 108 rotated clockwise. Due to the fact that the planetary gear 126 is prohibited from any clockwise rotation by virtue of the second oneway clutch bearing 124, it will be fixed with respect to the sun gear 116 such that the reel drive lever 108, the sun gear 116 and the planetary gear 126 should move clockwise as a unit. Thus the takeup reel assembly 112 is subjected to clockwise rotation with a view to winding up the protective cover strip 18 of the carrier tape 10 therearound. In the event that the tension exerted on the cover strip 18 exceeds a permissible value, the reel drive lever becomes no longer rotatable in the clockwise direction by reason of further backward movement of the shuttle rod 86 being absorbed by the coil spring 130. Accordingly, breakage or tear of the cover strip 18 does not take place in the process of winding up the latter. The support strip 16 from which the protective cover strip 18 has been peeled off is adapted to move forwardly over and along the sloping portion 98b of the tape retainer 98. The electronic component feeding operation as expounded above is repeatedly performed in an intermittent manner until the carrier tape 10 wound on the tape reel 12 will have been exhausted in its entirety.

While the invention has been described with reference to a preferred embodiment, it should be apparent to those skilled in the art that many changes and modifications may be made without departing from the spirit and scope of the invention as defined in the claims.

What is claimed is:

1. An electronic component feeder for supplying a succession of electronic components borne by a carrier tape towed a pickup position one after another, the carrier tape including a backing strip adapted to support the electronic components thereon and a protective cover strip adhesively bonded to the backing strip to hold electronic components in position, which comprises:

(a) means for supplying the carrier tape;
   (b) transfer means for intermittently transferring the carrier tape from the supplying means toward the pickup position each time at a predetermined pitch;
   (c) takeup means intermittently operable in synchronism with the transfer means for winding up the protective cover strip peeled from the carrier tape;
   (d) a shuttle rod operatively interconnecting the transfer means and the takeup means and having a plurality of locator holes each disposed along a length of the shuttle rod;
   (e) an actuator for causing intermittent reciprocating movement of the shuttle rod to drive the transfer means and the takeup means in concert, the actuator including a cylinder and a piston rod extendibly fitted into the cylinder;
   (f) an interconnector block fixedly attached to the piston rod at a first end and slidably engaged with the shuttle rod at a second end; and
   (g) a locator pin carried by the interconnector block for selective engagement with one of the locator holes of the shuttle rod to permit change of the predetermined pitch at which the carrier tape is transferred toward the pickup position.

2. The electronic component feeder as recited in claim 1, further comprising means for biasing the locator pin into engagement with one of the locator holes and a ring-shaped handle attached to the locator pin to assure ready removal of the locator pin out of the locator holes.

3. The electronic component feeder as recited in claim 2, further comprising means for guiding the carrier tape as it is being transferred from the supplying means toward the pickup position along a given travel path, the guiding means including at least one guide pin located upstream of the travel path, a guide block lying on the pickup position in a spaced relationship with respect to the guide pin and a tape retainer pivotably mounted above the guide block to have the carrier tape sandwiched between the tape retainer and the guide block.

4. The electronic component feeder as recited in claim 1, wherein the transfer means includes a main shaft, a rotary plate rotatably fitted to the main shaft and drivingly connected to a first end of the shuttle rod, a ratchet wheel mounted on the main shaft for rotation thereabout independently of the rotary plate, the ratchet wheel having a multiplicity of teeth formed along its perimeter, a sprocket assembly rotatably mounted on the main shaft for unitary rotation with the ratchet wheel, a tension spring for urging the rotary plate clockwise, a feed pawl pivotally carried by the rotary plate for causing the ratchet wheel and the sprocket assembly to rotate clockwise as the rotary plate is subjected to clockwise rotation and a detent pawl normally biased against the teeth of the ratchet wheel to prevent the ratchet wheel from any counterclockwise rotation.

5. The electronic component feeder as recited in claim 4, wherein the sprocket assembly includes a pair of spaced apart coextensive sprocket wheels and a hub adapted to rigidly interconnect the sprocket wheels together.

6. The electronic component feeder as recited in claim 5, wherein the takeup means includes a reel shaft, a reel drive lever rotatably mounted on the reel shaft and springably connected to a second end of the shuttle rod, a takeup reel assembly mounted on the reel drive shaft for rotation only in a first direction, a sun gear rigidly affixed to the takeup reel assembly for unitary rotation therewith, a support lever secured to the reel drive lever at one end, the support lever having at the other end a shaft parallel to the reel shaft, and a planetary gear carried by the shaft for rotation only in a second direction, the planetary gear kept in a meshing relationship with the sun gear.

7. The electronic component feeder as recited in claim 6, wherein the reel drive lever has at its distal end a pin extending generally perpendicularly therefrom and wherein the shuttle rod has a slot provided adjacent to the second end thereof to slidably receive the pin of the reel drive lever, the pin connected to the second end of the shuttle rod by a tension spring.

8. The electronic component feeder as recited in claim 1, wherein the takeup means includes a reel shaft, a reel drive lever rotatably mounted on the reel shaft and springably connected to a second end of the shuttle rod, a takeup reel assembly mounted on the reel drive shaft for rotation only in a first direction, a sun gear rigidly affixed to the takeup reel assembly for unitary rotation therewith, a support lever secured to the reel drive lever at one end, the support lever having at the other end a shaft parallel to the reel shaft, and a planetary gear carried by the shaft for rotation only in a second direction, the planetary gear kept in a meshing relationship with the sun gear.

9. The electronic component feeder as recited in claim 8, wherein the reel drive lever has at its distal end a pin extending generally perpendicularly therefrom and wherein the shuttle rod has a slot provided adjacent to the second end thereof to slidably receive the pin of the reel drive lever, the pin connected to the second end of the shuttle rod by a tension spring.

10. The electronic component feeder as recited in claim 9, further comprising means for biasing the locator pin into engagement with one of the locator holes and a ring-shaped handle attached to the locator pin to assure ready removal of the locator pin out of the locator holes.

* * * * *